United States Patent
Anderson, Jr. et al.

[11] Patent Number: 5,094,769
[45] Date of Patent: Mar. 10, 1992

[54] COMPLIANT THERMALLY CONDUCTIVE COMPOUND

[75] Inventors: Herbert R. Anderson, Jr., Patterson; Richard B. Booth; Lawrence D. David, both of Wappingers Falls; Mark O. Neisser, Hopewell Junction; Harbans S. Sachdev, Wappingers Falls; Mark A. Takacs, Poughkeepsie, all of N.Y.

[73] Assignee: International Business Machines Corporation, Armonk, N.Y.

[21] Appl. No.: 193,475

[22] Filed: May 13, 1988

[51] Int. Cl.$^5$ ............................ B09K 5/00; H01B 3/20
[52] U.S. Cl. .................................. 252/71; 252/623 T; 252/372; 252/573; 252/574; 252/73; 252/74; 252/75; 252/77; 252/78.1; 252/78.3
[58] Field of Search .................... 252/623 T, 572, 573, 252/575, 518, 520, 500, 70, 71, 73, 74, 75, 77, 78.1, 78.3, 574; 427/218, 219, 221; 106/266; 174/17 LF

[56] References Cited

U.S. PATENT DOCUMENTS

| | | | |
|---|---|---|---|
| 3,405,066 | 10/1968 | McGhee et al. | 252/63.5 |
| 3,495,133 | 2/1970 | Miller | 317/101 |
| 3,882,033 | 5/1975 | Wright | 252/78 |
| 4,265,775 | 5/1981 | Aakalu | 252/573 |

OTHER PUBLICATIONS

IBM Technical Disclosure Bulletin, vol. 25, No. 11A, 4/83, pp. 5740–5743, "Flexible Heat-Conducting Sheet Material for Semiconductor Packages" R. H. Lacombe et al.

IBM Technical Disclosure Bulletin, vol. 25, No. 10, 3/83, p. 5322, "Heat Transfer Compound" E. R. Mondou.

IBM Technical Disclosure Bulletin, vol. 24, No. 7A, 12/81, p. 3530, "Thermal Grease With Boron or Aluminum Nitride and Mineral Oil", N. G. Aakalu et al.

*Primary Examiner*—Josephine Barr
*Attorney, Agent, or Firm*—Ira David Blecker

[57] ABSTRACT

A compliant thermally conductive, preferably dielectric, compound that enhances the power dissipation capability of high-powered electrical components such as bipolar VLSI semiconductor chips. The compound has chemically stable thermal conduction and viscosity properties; is not subject to phase separation during use and may be applied in small gaps to maximize thermal conduction. The compound preferably comprises a liquid carrier having thermal filler particles dispersed therein and a coupling agent having a functionality which is reactive with the calcined surface of the thermal filler particles, and a functionality having preferential wetting of the thermal filler particles over self-condensation. Additional additives such as fumed silica and polyisobutylene enhance the phase stability and resistance to thermo-mechanical shear force degradation of the thermally conductive compound encountered during functional usage, e.g., fluctuating power cycles.

45 Claims, 3 Drawing Sheets

COMPLIANT THERMALLY CONDUCTIVE COMPOUND

BACKGROUND OF THE INVENTION

1. Field of the Invention

The present invention relates to high thermal conductivity, nonbleeding greaselike compounds having a high packing density which are used primarily as a heat transfer means for cooling electronic components such as VLSI chips.

2. Description of the Prior Art

With the high density capabilities and fast switching speeds afforded by VLSI chips, various improved means of dissipating the unprecedented amounts of heat generated by VLSI chips and other solid state components have been pursued. One such means is a thermal compound commonly referred to as thermal grease, which is most commonly used to conduct heat from area arrays of solder-ball attached integrated circuit chips of a packaging module to a heat conducting means or a heat sink as shown in FIG. 1. As VLSI density increases, so does the power of each chip and the associated packaging module when multichip modules are used. The requirements associated with cooling high-powered chips (e.g., state of the art bipolar chips may generate 60 watts per square centimeter area or greater) dictate that the thermal conduction compounds such as thermal grease must have a high thermal conductivity (and preferably being an electrical insulator) while being of low viscosity and compliant so that the thermal compound can be easily applied to the surfaces of the chips to be cooled and can conform ultimately with the microscopically rough surface of the chips, which are often bowed or tilted to minimize air gaps which are detrimental to the cooling process. Low viscosity is also required because the chips and solder bonds that usually attach the chips to a substrate are fragile and the force applied by the thermal grease to the chip must be minimal in magnitude while maximum in contact to minimize interface thermal resistance so that a good thermal path is formed. It is a further requirement that the thermal grease compound be able to withstand power cycling at high chip powers with the attendant mechanical stresses arising from the differences in coefficients of thermal expansion of the various material systems over the life of a module without the compound degrading significantly in thermal conductivity or mechanically, such as experiencing phase separation between the liquid and solid components of the compound.

There are numerous thermal grease compounds available in the art. Heretofore, however, none have satisfied the combined requirements of high thermal conductivity, high electrical resistivity, low viscosity, compliance, and resistance to phase separation or degradation in property stability (thermal conductivity, viscosity, etc.) of the present invention. For example, U.S. Pat. No. 3,405,066 teaches the use of particles such as boron nitride or silicon dioxide in a dielectric fluid such as mineral oil for the purposes of conducting heat from electrical devices and equipment. The use of the '066 thermal grease in state of the art VLSI systems wherein chip powers exceed 30–60 watts per square centimeter has been found not to be adequate because the heat conductive particles separate from the dielectric liquid carrier when the chips experience fluctuative power cycling during this operation, (chips experience temperature differences of greater than 50 degrees centigrade between the inactive and fully active states). This phase separation leads to a decrease in thermal conductivity wherein the thermal compound would eventually not be adequate to dissipate the required amount of heat from the semiconductor chips.

U.S. Pat. No. 3,882,033 to Wright teaches that organopolysiloxane grease compositions have good dielectric and heat transfer properties can be obtained by utilizing certain proportions of polysiloxane fluid, a dielectric desiccant selected from anhydrous calcium sulfate and synthetic zeolites, and a grease thickening and thermal conducting agent. Materials such as anhydrous calcium sulfate and synthetic zeolite have lower intrinsic thermal conductivities compared with the particles described in the present invention. Also, no means or process is shown for achieving high particle packing density to further increase thermal conductivity or to inhibit separation of the particles from the liquid carrier in such pastes in contact with chips operating at high and fluctuating power cycling.

A flexible heat conducting sheet having thermally conducting boron nitride particles dispersed within is described in the IBM TDB dated Apr. 1983, pp. 5740–5743 by Lacombe et al. Lacombe et al. used polyisobutylene (PIB) as the organic carrier which has a very high loading density of boron nitride particles in the carrier. This is not suited for the present application wherein low viscosity and compliance is required in a mobile dielectric medium so that the thermal compound can intimately conform to the semiconductor devices to be cooled.

The thermal compound must also be applied as a thin layer so that the thermal path is as small as possible. The small gap results in excessive mechanical shear stress on the thermal compound that, when combined with thermal stress from high temperatures and power cycling, causes phase separation during power cycling of thermal compounds heretofore known. Low viscosity is also required to accommodate chip tilt and any chip surface irregularities while the thermal grease compound must exhibit rapid stress relaxation to limit the amount of force transmitted to the chips.

IBM TDB dated Mar. 1983, pp. 5322 by Mondou et al describes the use of boron nitride particles in a poly(alpha-olefin) carrier with wetting agents incorporated therein. The particles in Mondou et al are not at a higher surface energy than the carrier, thus wetting of the particle surfaces by the organic carrier is not spontaneous. This reference does not suggest the unique characteristics required and taught by the present invention, which allow for high thermal conductivity, high electrical resistivity, low viscosity, and chemical stability (does not oxidize or cause corrosion, keeps thermal conductivity and viscosity relatively constant) while eliminating phase separation during power cycling. A similar thermal grease is described by Mondou et al in the IBM TDB dated Mar. 1983, pages 5320–21 wherein it is indicated that the thermal conductivity is greater than 1.25 Watts per meter-degree C (W/m-° C.). This compound also will not provide high thermal conductivity while also providing low viscosity and eliminating phase separation during power cycling of the high powered chips required in state of the art VLSI and VLSI applications.

IBM TDB to Aakalu et al. dated Dec. 1981, pp. 3530 employs a thermally conductive powder dispersed in a mobile hydrocarbon fluid, resulting in a dielectric medium. Aakalu et al. teach the use of hydrated silica to enhance the resistance of the thermal grease to phase separation. The thermal conductivities achieved by this thermal grease are in the range of 1 Watt per meter-degree C with 71.4 weight percent boron nitride loading. This relatively high loading results in a paste having a viscosity that causes the paste to be not mobile enough to be placed into thin gaps without threatening either cracking large area chips and/or their associated solder bonds when applied thereto. In addition to the relative high viscosity of the Aakalu et al. TDB, it has been found by the inventors that phase separation occurs if this type of compound is powered at high fluctuating power cycling levels, causing a mechanical shearing of the applied thin film of the thermal grease compound. i.e. in the range of greater than 30 to 60 $W/cm^2$.

U.S. Pat. No. 4,265,775 to Aakalu et al. describes a thermal filler powder of laminar or dendridic shapes in a silicone liquid carrier which incorporates silica fibers to help prevent bleeding of the particles from the liquid carrier due to its high surface area. Even though this disclosure inhibits bleeding for certain applications, it has been found that at repeated power cycling and chip temperatures over 80° C. that bleeding is not prevented by the addition of mere silica alone. Moreover, the wetting agents and liquid carrier described in the '775 thermal compound are not suitable for the present application because they cannot be removed completely by solvents; and thus causes metallurgical non-wetting problems during rework of solder joints, and contamination of other surfaces in multichip packages and the tooling (i.e. furnaces, etc.) used for assembling such packages.

In view of the above there exists a need in the art for stable thermal conducting compounds having a high thermal conductivity and high electrical resistivity, while also having a relatively low viscosity so that compound exists as a mobile medium which can easily be applied and conformed to, and wet the surface of the chips to be cooled while not exerting forces to crack the chips or solder bonds which attach the chips to substrates. It is also required that there be no phase separation between the liquid carrier and thermally conductive particles, or degradation in viscosity or thermal conductivity during power cycling of high powered VLSI and VLSI chips and that the thermal compounds are capable of being applied in thin layers so that the total thermal resistance path through the thermal compound is as low as possible. The thermal compound must also be capable of withstanding reciprocating mechanical shear stress during power cycling. Such thermal mechanical stressing occurs when the thermal compound is in the small gap between a chip and an internal thermal enhancement such as a spring loaded piston as shown in FIG. 1B, or between the chip and a cap as shown in FIG. 1A. There is also a need for the compound to be readily cleanable from chips and metal surfaces to facilitate rework of chips.

SUMMARY

A primary object of the present invention is to provide a phase-stable, thermally conductive compound, having a relatively constant thermal conductivity and viscosity, for transferring heat from electronic compounds, such as integrated circuit chips, wherein no phase separation occurs between the thermally conductive particles therein and the dielectric liquid carrier when the compound is exposed to high heat loads (i.e. 30–60 $W/cm^2$ or greater) with temperature variations during power cycling.

A further object of the present invention is to provide such compounds having a relatively high packing density of thermally conductive particles and high thermal conductivity, while also having a low viscosity so that the compound is a mobile medium which can be applied easily and conform to the surface of integrated circuit chips, without cracking the chips or solder bonds between chips and substrate.

It is a further object that the thermally conductive compound be capable of wetting surfaces when being applied in thin layers in gaps to provide as low a stable thermal resistance as possible, and withstand the shear forces without phase separation that result when such a compound is applied to a thin gap between an integrated circuit chip and internal thermal enhancement device which are subjected to fluctuating power densities causing thermomechanical stressing of the thermal compounds.

Still further objects are that the thermally conductive compound be electrically insulating so that the electrical function of the integrated circuit chip will not be interfered with and that the compound be cleanable in common to facilitate rework.

A further object is that the particles be evenly dispersed in, and wet by, the liquid carrier and do not flocculate during use.

A further object is that the thermally conductive compound be solvent cleanable from surfaces of materials used in the semiconductor packaging industry.

These objects as well as other advantages are accomplished by the present invention which provides a phase-stable, thermally conductive compound having at least a dielectric, (preferably a chemically saturated oily hydrocarbon liquid carrier;) thermal filler particles of higher surface energy than the liquid vehicle, and a high thermal conductivity, such as calcined boron nitride or aluminum spheres having an anodized aluminum coating evenly dispersed through the carrier; and a coupling agent from the class of organometallics, (e.g., from the group of organosilanes, organotitanates, organoaluminates, or organozirconates), having a functionality which is reactive with the surface of the particles, and a functionality having a preferential wetting of the particles over self-condensation. The preferred thermal compound also contains high surface area fumed silica to resist the propensity of the oily liquid to separate from the compound at extremely high operating temperatures or during excessive power cycling over extended periods of time; as well as a chemically stable polymer (e.g., polyisobutylene) which further prevents phase separation when it is applied in a way to foster preferential adsorption on the particles and thereby stabilize the dispersion, (i.e. resist flocculation of particles). the compound is of low viscosity and has low surface energy to conform to and wet the surface of the chips of varying roughness, tilts, and heights, (e.g. preferably viscosity between approximately 2 million centipoise and approximately 20 million centipoise), while having a high particle packing density for maximum thermal conductivity and maintaining consistent particle dispersion throughout, preventing phase separation because the absorbed polymer serves to prevent intrinsic aggregation of particles through entropic repulsion, and concomitantly has a chemical structure similar to that of the hydrocarbon oil to cause an affinity between them. To best accomplish this, it is most preferred that the thermal filler particles be cubic or spherical in shape for optimum loading and minimum viscosity. The phase stable compound is not corrosive to materials usually used in high performance VLSI packages such as solder, copper, molybdenum, chromium, ceramic, etc. and is easily and completely removable from such materials by simple organic solvents so that packages may be metallurgically reworked without experiencing nonwettable metallurgical surfaces due to residual low surface energy organic residues. A process sequence that must be followed to successfully make the stable thermally conductive compound is also disclosed.

DESCRIPTION OF THE PREFERRED EMBODIMENTS

Figure 1A:
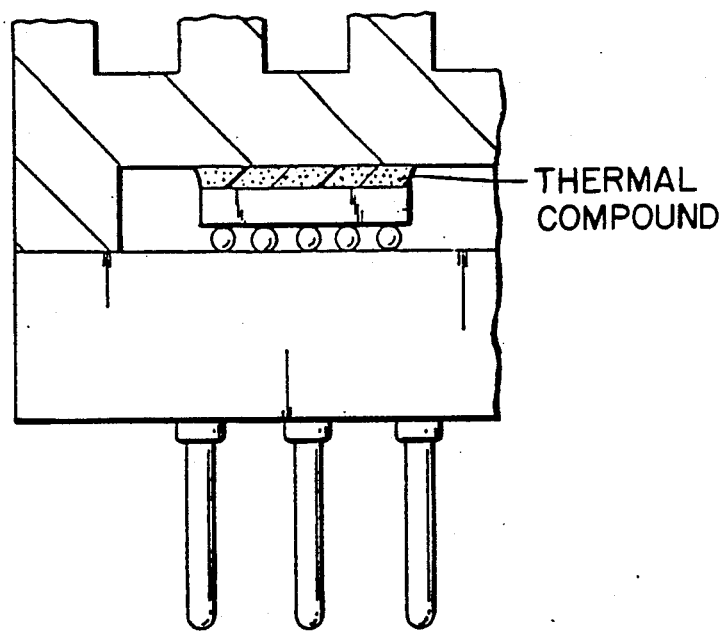
FIGS. 1A and 1B show typical semiconductor packages in which the thermal compound of the present invention may be used.

The present invention provides a novel thermally conductive grease-like compound which has heretofore not existed in the art, and which has advantages and performance that was not heretofore possible in the art. The thermally conductive compound is of low viscosity, typically in the range of 2 million to 20 million centipoise at 100° C., which makes it a low viscosity grease-like or paste-like substance which is compliant enough to follow the contour of and chemically wet semiconductor chips or the cooling surfaces in contact with semiconductor chips mounted on a packaging substrate regardless of variations in chip tilt or chip height which are commonplace in state of the art multichip modules, especially those using area arrays of solder balls for chip connections as described in U.S. Pat. No. 3,495,133, entitled "Circuit Structure Including Semiconductive Chip Devices Joined to A Substrate by Solder Contacts". Specific components of working examples made in accordance with the thermally conductive grease-like compound of the present invention are listed in TABLE I, wherein specific thermal filler particles are dispersed throughout a chemically matched liquid carrier, and selected classes of additives which enhance dispersion and stability are incorporated. The liquid carrier is typically an oily, solvent cleanable dielectric fluid, preferably a hydrocarbon liquid carrier, which is nonpolar and chemically saturated so that it does not absorb moisture and thereby cause corrosion of thin metal films in the module. The liquid carrier retains the thermal filler particles which are evenly dispersed throughout the liquid carrier and remain dispersed through the life of the compound due to the novel formulation disclosed herein. For the resulting compound to be mobile and compliant, the liquid carrier should typically have a viscosity of approximately 30 centipoise to about 500 centipoise at 100° C. Preferred are non-polar, low surface energy organic fluids having a viscosity of 40 to 150 centipoise at 100° C. Dielectric fluids such as mineral oil and synthetic mineral oil (e.g., synthetic poly(alpha-olefin)), are acceptable, and preferred are fluids which can be represented by the the following chemical formula:

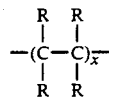

where X is 6-50 and R is H, or alkyl substituents.

The most preferred liquid carrier is chemically saturated poly(alpha-olefin) having a viscosity of approximately 80-120 centipoise at 100° C. The polarity of the carrier should preferably match the polarity of certain additives which will be described hereinafter. The polarities should match because this promotes mutual affinity so that phase separation is minimized. It is most preferred that the polarity of the carrier be nonpolar so that the affinity for moisture will be low and corrosion will not occur.

The thermal filler particles exhibit a relatively high thermal conductivity, (for example, boron nitride, vanadium boride, and aluminum spheres coated with an anodized aluminum coating, and combinations thereof). The preferred shape is uniform spheres or cubes so that packing density is maximized while providing a low viscosity of the dispersion of particles in an oily nonpolar vehicle that enables uniform dispersion of particles and inhibits flocculation. Even though uniform spheres or cubes are most preferred, the present invention meets the above objects with thermal particles of alternative shapes such as platelets. The higher packing density aids in the reduction of phase separation, and provides a conduction system that facilitates high thermal conductivity. Dispersion of the particles, reduction of phase separation and lower viscosity are further facilitated by the addition of a coupling agent, which will be described hereinafter.

The particles are preferably electrical insulators so that they can readily be utilized in multichip modules used in VLSI computer systems which in many instances require electrical isolation between chips on the multichip modules. It is imperative that the thermal filler particles be higher in surface energy than the liquid carrier so that the liquid carrier adequately wets the particles. This is accomplished by treating the particles so that they are free of contaminants, particularly adsorbed organic compounds. It has been found that this is most efficiently done if the thermal filler particles are calcined. Alternative methods such as RF plasma ashing may be used to treat the surface of the particles. In the working examples that follow, all particles are calcined unless otherwise noted. The preferred volume percentage of thermal filler particles in the liquid carrier is between approximately 25% and 65% and foreseeably could be higher depending on the required compliance of the thermal compound. Even though it is commonly practiced by those skilled in the art to increase the volume concentration of the thermal filler particles to increase the thermal conductivity of thermal compounds such as thermal grease, it has been found in the present invention that very high packing densities make the resulting thermal compound noncompliant, and sensitive to mechanical fracture during power cycling, and that such high packing densities do not necessarily result in the highest thermal conductivities. It is preferred that the aforementioned treated thermal filler particles be oleophilic after treatment so that the particles will be wetted by the low surface energy, solvent cleanable liquid carrier to facilitate dispersion and rework. The novel combination of liquid carrier and thermal filler particles described above in addition to the other components of the present invention to be described hereinafter and their relative proportions provide a high thermal conductivity of greater than 1.3 W/m° C. while being compliant and meeting the phase separation criteria as well as other objectives of the present invention.

A critical component of the present invention is a coupling agent. Preferably, the agent is applied on the particle surfaces, and functions to decrease the phase separation between the liquid carrier and thermal filler particles and foster lower viscosities by dispersing the thermal filler particles and preventing their flocculation at high power densities, which are encountered in state of the art VLSI modules. The coupling agent has at least one functionality which is reactive with the preferably calcined surface of the thermally conductive filler particles and at least one functionality which is of similar polarity as the liquid carrier. The coupling agent has a preferential wetting of the particles over self-condensation. It is preferred that there be some self-condensation as well to provide a veneer around the particles to thereby lessen the tendency of the particles to flocculate. The coupling agents meeting these functional criteria are typically selected from the group consisting of organosilanes, organotitanates, organoaluminates, or organozirconates. The preferred operable organosilanes are represented by the formula:

$(RO)_x SiR'_y$ wherein
$x+y=4$; $x, y \neq 0$ (preferably $x=3, y=1$)
$R = C_n H_{2n+1}$,
$R' = C_n H_{2n+1}$ $n > 10$ The functionality which is reactive with the thermally conductive filler particles is (RO) and the functionality which is of similar polarity as the liquid carrier is (R').

The preferred operable organotitanates are represented by the formula:

$$(RO)_x Ti(O\overset{O}{\overset{\|}{C}}R')_{4-x}$$

wherein
$R = C_n H_{2n+1}$
$R' = C_n H_{2n+1}$, $n > 7$

The functionality which is reactive with the thermally conductive filler particles is (RO) and the functionality which is of similar polarity as the liquid carrier is:

$$(O\overset{O}{\overset{\|}{C}}R').$$

The preferred operable organozirconates are represented by the formula:

$$(RO)_x Zr(O\overset{O}{\overset{\|}{C}}R')_{4-x}$$

wherein $R = C_n H_{2n+1}$
$R' = C_n H_{2n+1}$, $n > 7$

The functionality which is reactive with the thermally conductive filler particles is (RO) and the functionality which is of similar polarity as the liquid carrier is:

$$(O\overset{O}{\overset{\|}{C}}R').$$

The preferred operable organoaluminates are represented by the formula:

$Al(RCOCHCOR')_n(OR'')_m$ wherein
$n+m=3$, $n \neq 0$
$R, R', R'' = C_n H_{2n+1}$ In the most preferred embodiments wherein the liquid carrier is a chemically saturated solvent soluble poly(alpha-olefin), and any calcined boron nitride particles or aluminum spheres coated with an anodized layer are dispersed throughout, the preferred coupling agent is isopropyl triisostearoyl titanate.

$$CH_3CH(CH_3)-O-Ti-[O-\overset{O}{\overset{\|}{C}}C_{17}H_{35}]_3$$

The range of percentages of the coupling agent in the stable thermal compound of the present invention is between 0.5 and 10 weight percent. Precise compositions are specifically taught in the working examples which follow hereafter. Preferably, the polarity of one part of the coupling agent must be nonpolar to match the chemical nature of the poly(alpha-olefin) liquid carrier, so that the properties (i.e. thermal conductivity, viscosity, etc.) of the compound remain stable at high VLSI operating temperatures and during power cycling, and the compound does not experience excess phase separation.

In addition to providing a compound having excellent thermal conductivity while being compliant to conform to, and wet the higher surface energy surfaces of cleaned semiconductor chips, and not exhibiting phase separation between the thermal filler particles and liquid carrier while remaining stable during power cycling; the basic components are combined to satisfy other requirements of state of the art VLSI multichip modules. The basic components can be combined depending on the specific system requirements. The stability of the thermally conductive compound in preferred form is further enhanced by the addition of chemically inert particles of high surface area to resist phase separation by absorbing excess liquid carrier in those situations where chip power cycling leads to thermal/mechanical stressing of the compound and a propensity for the compound to bleed. It has been found that in the present phase and property stable thermal compound consisting of an organic liquid carrier, thermal filler particles evenly dispersed therein, and a coupling agent as described above, that fumed silica particles of approximately 100–300 m²/gram in surface area increase the capacity of the compound to avoid irreversible bleeding. It is preferred that the fumed silica be treated to provide a polar, hydrophobic surface, for example, by silyating surface hydroxyl groups. The hydrophobicity improves the affinity of the fumed silica for the liquid carrier of the present invention. The hydrophobic fumed silica has little or no tendency towards self-agglomeration, so that it provides a minimal viscosity increase when added to the thermal compound of the present invention. The coupling agent also enhances particle dispersion so that lower viscosity is attainable while thermal conductivity is maximized.

Figure 1B:
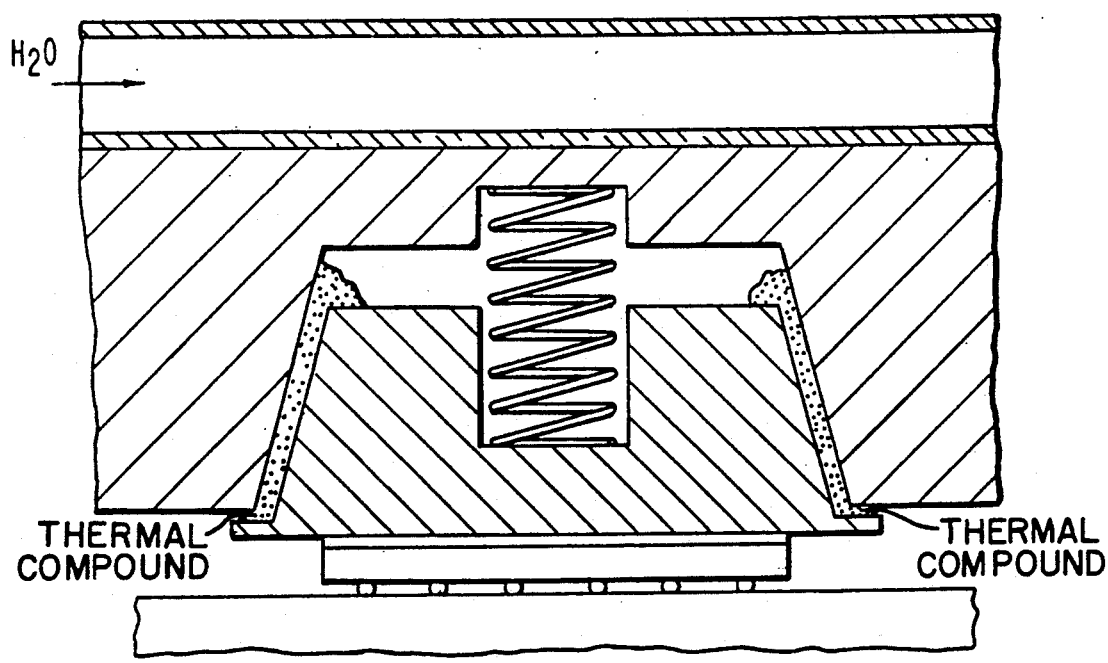

In addition to the thermal compound having a high thermal conductivity, it is known to those skilled in the art that the thermal compound or thermal grease must be applied in as thin a layer as possible to achieve maximum thermal performance. When the low viscosity thermal compound of the present invention is applied to a small gap (e.g., 2 mils or less) between a chip and internal thermal enhancement (see FIG. 1B), the resultant shear forces that are applied to the grease-like thermal compound are relatively high and are a further cause of phase separation and structural damage to the thermal compound, especially during power cycling. This results in a reduced capacity to dissipate heat. It has been found that in the present stable thermal compound that the addition of a polymer that readily dissolves in the chosen liquid carrier enhances the shear stability of the compound. The role of the polymer helps the compound to resist flocculation of particles and the attendant phase separation. To facilitate rework of a multichip module, the polarity of the polymer should preferably match that of the oily carrier liquid. This allows the resultant compound to be easily removed by organic solvents from surfaces that the compound may typically be exposed to. In VLSI semiconductor modules, such surfaces are semiconductor materials, solders, insulators such as ceramic, and metals such as gold, copper, molybdenum, chromium, and titanium. The preferred polymer is a nonpolar elastomer which matches the polarity of the preferred poly(alpha-olefin) liquid carrier, namely polyisobutylene. The resultant thermal compound is also noncorrosive toward the packaging materials due to its hydrophobicity. It is also advantageous to incorporate an antioxidant so that any inadvertitous exposure of the compound to oxygen or other oxidizing agents will not cause a chemical change causing phase separation.

Figure 3:
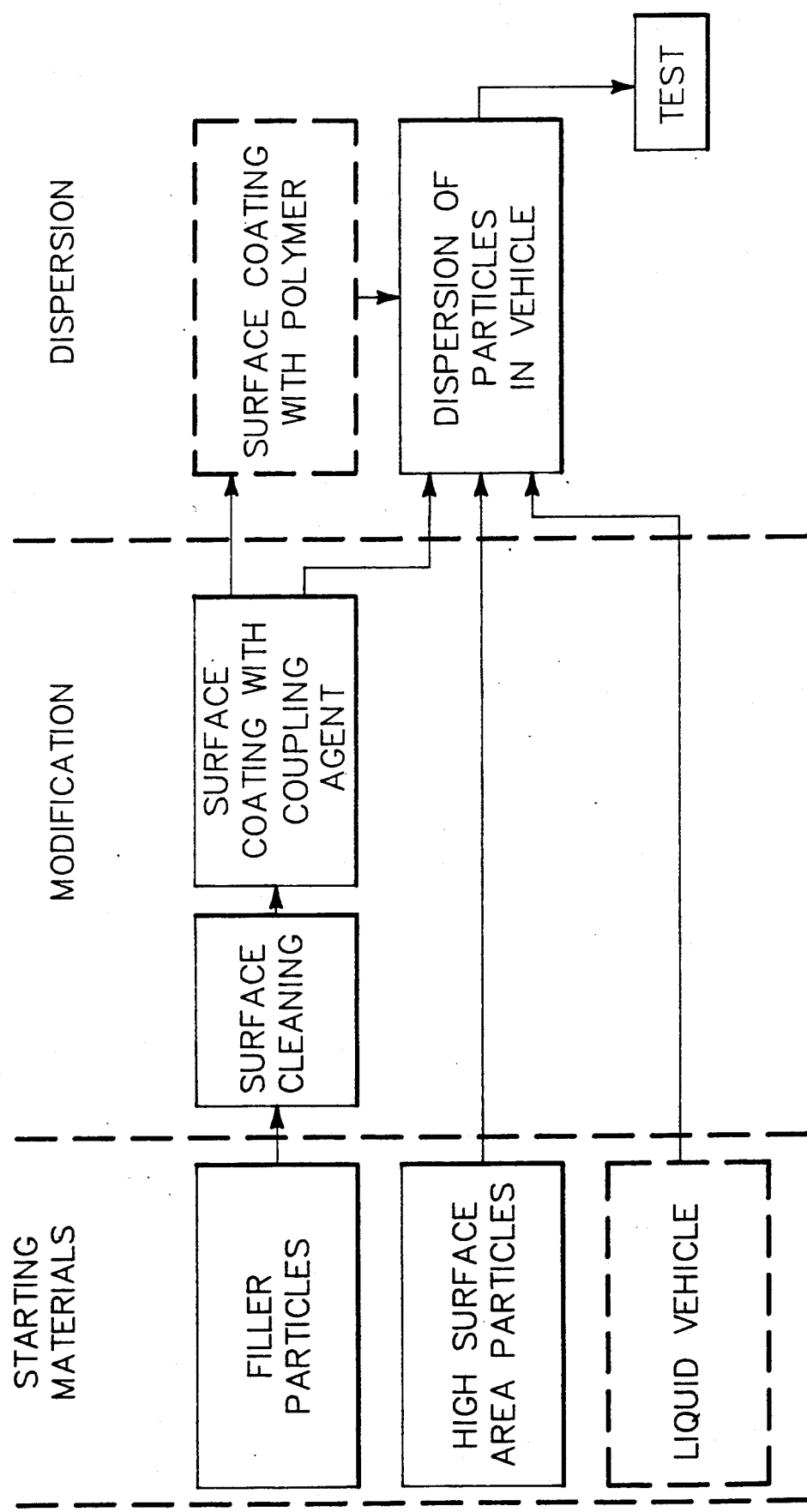
FIG. 3 is a flow chart depicting the preferred process for forming the phase-stable and thermally stable conductive compound of the present invention.

The above described components can be combined in various proportions as taught by the working examples which follow hereinafter. The general process requirements for forming the various stable thermal compounds embodied by the present invention in the working examples are as shown in the flow chart of FIG. 3 and are described as follows.

Generally, the thermally conductive particles are treated before they are dispersed throughout the liquid carrier so that their surfaces are activated. The particle surfaces are first activated by heat treating, preferably calcining in air, in order to remove low surface energy organic contaminants adsorbed from the ambient (e.g., during storage), and so that they are capable of interacting with the coupling agent. After activation, the particles are coated with a coupling agent, (i.e., typically an organosilane, organotitanate, organozirconate, or organoaluminate, as described above), which renders it more readily dispersible in the liquid carrier in which the particles are to eventually be dispersed by breaking up agglomerates of particles and thereby lowering viscosity of the dispersion. After the particles are thus coated, they are preferably coated with a polymer (e.g., polyisobutylene) by solution/solvent removal techniques, after which, they are dispersed into the liquid carrier until a homogeneous compound is formed. The polyisobutylene is not essential for all operating conditions. In a system having boron nitride particles of approximately 0.01 to 30 microns in diameter, and a synthetic mineral oil such as a high viscosity poly-(alpha-olefin) as the liquid carrier, the dispersion is preferably accomplished by shearing with a conventional three roll mill, so that the particles are evenly dispersed throughout the compound. It has been found that the optimum amount of coupling agent to be coated onto the particles is determined by coating the particle surface with the coupling agent until no further lowering of the viscosity of the resulting compound occurs. The coupling agent amount that provides the lowest viscosity is adequate for providing even particle dispersion and preventing phase separation while providing a mobile medium which can conform to the surface contour of the chips without causing undue forces on the chips which could fracture the chips or the solder bonds which connect them to the semiconductor package. The addition of polyisobutylene for shear stability, or fumed silica may be accomplished by techniques noted above and indicated in the process flow diagram of FIG. 3.

Figure 2:
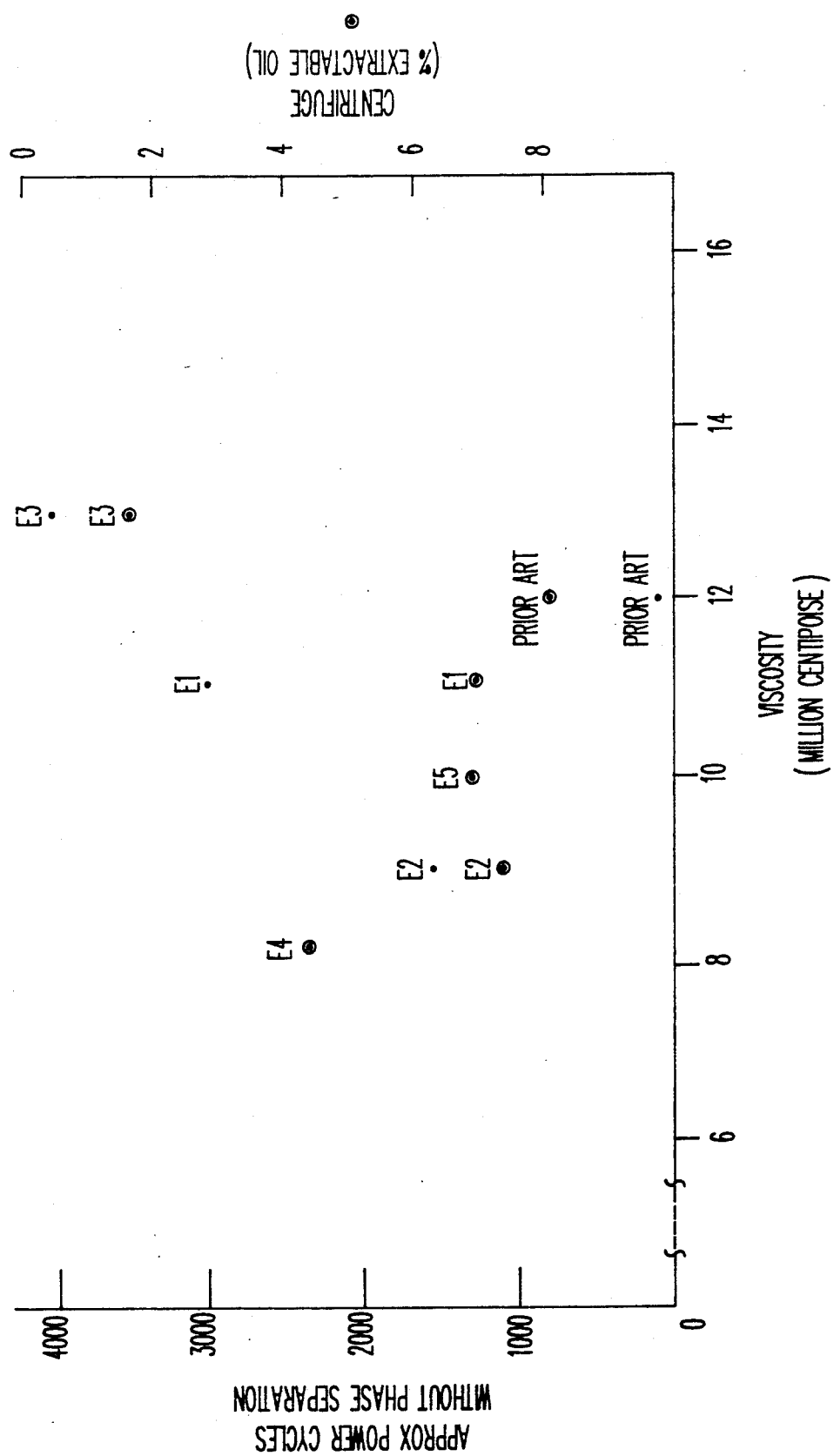
FIG. 2 is a graph of the resistance to phase separation and power cycle lifetimes as a function of viscosity of various thermal compounds within the scope of the present invention.

The resultant compound must be of low enough viscosity to be mobile during module assembly to follow the surface contour of chips, but must be viscous enough so as to be stable mechanically when applied in small gaps to form the heat conductive path, especially when exposed to power fluctuations. In state of the art semiconductor modules, these gaps are as low as 2 mils or less to minimize the length of the thermal path. This small gap causes high shear forces to be applied to the thermal compound, which adds to the stability problem. To satisfy these criteria, as well as accomplishing all of the other advantages provided by the thermally conductive compound of the present invention, it is preferred that the compound comprise from approximately 25% by volume to approximately 65% by volume of thermally conductive filler particles, from approximately 0.5% by weight to approximately 10% by weight of coupling agent, and the balance being the liquid carrier. If desired or required, approximately 1% to approximately 6% by weight of fumed silica particles and/or approximately 2% to approximately 6% by weight polyisobutylene are also added. The thermally conductive compound of the present invention has been generally described above. The following are preferred examples of practicing the present invention. In the example; the boron nitride particles have an average particle size, (i.e., equivalent spherical diameter), of 1 micron, while the aluminum spheres have an average size of 5-15 microns, and the vanadium boride particles have an average particle size of 1-8 microns. The examples using boron nitride filler particles have been tested for stability and phase separation by accelerated testing methods, (i.e. centrifuge process, actual power cycling or both). In each example, the thermal compound was applied in a gap of approximately 2 mils, in a module as depicted in FIG. 2, and then power cycled. The preferred thickness range that the thermal compound should be applied in is from 1 to 10 mils to facilitate high thermal conductivity. The centrifuge conditions were at 55° C. for 24 hours at an acceleration of approximately 1800 times the gravitational force. It has been found that thermal compounds which exhibit relatively good stability during centrifuge testing are also stable during power cycling. The power cycling conditions were such that the grease-like thermal compound experienced temperature variations of approximately 60° C. twice an hour in an approximately 2 mil gap between a chip and module hardware. The available power cycling and centrifuge data is included in the working examples. In each working example, the thermally conductive compound was readily removed by common solvents such as hexane, toluene, and other solvents known to those skilled in the art, and was not corrosive to any module components.

tetrakis (methylene(3,5-di-tert-butyl-4-hydroxyhydrocinnamate) methane) were mixed with 45 grams of a synthetic poly(alpha-olefin) oil having a viscosity of 40 centipoise by roll-milling. 1.1 gram of polyisobutylene was added to the mixture. The resultant roll-milled thermal compound has a viscosity of approximately 9 million centipoise and has a thermal conductivity of approximately 1.3 W per meter-° C. The compound was stable for over 1500 power cycles without phase separation, and 7.5 percent by weight of oil was extracted

SUMMARY OF WORKING EXAMPLES

| EXAMPLE | BASIC MATERIALS | VOLUME % SOLID | VISCOSITY (Million cps) | THERMAL CONDUCTIVITY (W/M °C.) | EXTRACTABLE OIL (%) | # OF POWER CYCLES TO PHASE SEPARATION |
|---|---|---|---|---|---|---|
| Prior Art (e.g. Mondou et al IBM TDB, 3/83, p. 5322) | Boron Nitride Mineral Oil | 33 | 12 | 1.1 | 8 | <150 |
| #1 | Boron Nitride Mineral Oil Organotitanate | 33 | 11 | 1.4 | 7 | >3000 |
| #2 | Boron Nitride Polyalphaolefin Oil Organotitanate Polymer | 32 | 9 | 1.3 | 7.5 | >1500 |
| #3 | Boron Nitride Polyalphaolefin Oil Organotitanate Polymer Silica | 27 | 13 | 1.4 | 1.5 | >4000 |
| #4 | Boron Nitride Polyalphaolefin Oil Organotitanate | 32 | 8 | 1.0 | 4.5 | — |
| #5 | Boron Nitride Polyalphaolefin Oil Organosilane | 32 | 10 | 1.4 | 6.9 | — |
| #6 | Oxide Coated Aluminum Spheres Polyalphaolefin Oil Organotitanate | 59 | 15 | 3.2 | — | — |
| #7 | Vanadium Boride Polyalphaolefin Oil Organotitanate | 50 | 5 | 1.8 | — | — |

EXAMPLE 1

Boron nitride thermal filler particles of approximately 0.01 to 44 microns in equivalent spherical diameter each were calcined and then coated with 0.44 grams of an organotitanate coupling agent isopropyl triisostearoyl titanate, i.e. $C_3H_7OTi(OOCC_{17}H_{35})_3$. 28 grams of the coated boron nitride particles and 22 grams of mineral oil were mixed by roll milling. The resultant roll-milled thermal compound has a viscosity of approximately 11 million centipoise. The thermal conductivity is 1.4 W per meter-° C. The grease-like thermal compound was stable for over 3000 power cycles without phase separation, and 7 percent by weight of oil was extracted from the compound during accelerated centrifuge testing.

EXAMPLE 2

Boron nitride thermal filler particles of approximately 0.01 to 44 microns in equivalent spherical diameter each were calcined and then coated with 1.1 grams of an organotitanate coupling agent isopropyl triisostearoyl titanate, i.e. $C_3H_7OTi(OOCC_{17}H_{35})_3$. 55.0 grams of the coated boron nitride particles and 0.1 gram of an antioxidant (a sterically hindered phenol such as tetrakis (methylene(3,5-di-tert-butyl-4-hydroxyhydrocinnamate) methane) were mixed with 45 grams of a synthetic poly(alpha-olefin) oil having a viscosity of 40 centipoise by roll-milling. 1.1 gram of polyisobutylene was added to the mixture. The resultant roll-milled thermal compound has a viscosity of approximately 9 million centipoise and has a thermal conductivity of approximately 1.3 W per meter-° C. The compound was stable for over 1500 power cycles without phase separation, and 7.5 percent by weight of oil was extracted from the compound during accelerated centrifuge testing.

EXAMPLE 3

Boron nitride thermal filler particles of approximately 0.01 to 44 microns in equivalent spherical diameter each were calcined and then coated with 1.1 grams of an organotitanate coupling agent isopropyl triisostearoyl titanate, i.e. $C_3H_7OTi(OOCC_{17}H_{35})_3$. 54.9 grams of the coated boron nitride particles and 0.21 grams of a sterically hindered phenol antioxidant (i.e. tetrakis (methylene(3,5-di-tert-butyl-4-hydroxy-hydrocinnamate) methane) as per example 4) were mixed with 41 grams of a synthetic poly(alpha-olefin) oil having a viscosity of 100 centistokes by roll milling. 1.1 grams of polyisobutylene and 1.6 grams of a hydrophobic (average surface area of 100 m²/gm) fumed silica were added to the mixture. The resultant roll-milled thermal compound has a viscosity of approximately 13 million centipoise and has a thermal conductivity of approximately 1.4 W per meter-° C. The compound survived power cycling for over 4000 cycles without phase separation, and had 1.5% by weight of oil extracted during accelerated centrifuge testing.

EXAMPLE 4

Boron nitride thermal filler particles of approximately 0.01 to 44 microns in equivalent spherical diameter each were calcined and then coated with 0.56 grams of an organotitanate coupling agent, n-propyl tri-n-decanoyl titanate, n-$C_3H_7Ti(OOCC_9H_{19})_3$. These coated particles were mixed into a poly(alpha-olefin) liquid carrier. Approximately 28 grams of the boron nitride particles and approximately 22 grams of the liquid carrier were mixed by roll mixing. The resultant roll milled thermal compound has a viscosity of approximately 8 million centipoise. The thermal conductivity is 1.0 W per meter-° C. The compound had 4.6% by weight oil extracted during accelerated centrifuge testing.

EXAMPLE 5

Boron nitride thermal filler particles of approximately 0.01 to 44 microns diameter each were calcined and then coated with 0.44 grams of an organosilane coupling agent octa-decyltriethoxysilane $(C_2H_5O)_3$-$SiC_{18}H_{37}$. Approximately 28 grams of the coated boron nitride and approximately 22 grams of poly(alpha-olefin) oil were mixed by roll mixing. The resultant compound has a viscosity of approximately 10 million centipoise. The thermal conductivity is 1.4 W per meter-° C. The compound had 6.9% by weight oil extracted during accelerated centrifuged testing.

EXAMPLE 6

90 grams of spherical aluminum filler particles coated with a thin oxide coating were combined with 8 grams of boron nitride filler particles. The particles were coated with approximately 1.6 grams of the organo-titanate coupling agent of example 1. These particles were roll milled with 19.6 grams of synthetic poly-(alpha-olefin) oil of 40 centipoise viscosity. The resultant compound has a viscosity of approximately 15 million centipoise. The thermal conductivity is approximately twice as high as that of example 1, i.e., approximately 3.2 W per meter-° C.

EXAMPLE 7

83.7 grams of vanadium boride particles and 0.1 gram of antioxidant (a sterically hindered phenol, in this case, tetrakis (methylene (3,5-di-tert-butyl-4-hydroxyhydrocinnamate)methane) were mixed and the particles were coated with approximately 0.8 grams of the organotitanate coupling agent of example 1. The coated particles were roll milled with 15.4 grams of poly(alpha-olefin) oil having a viscosity of 100 centipoise. The resultant compound has a viscosity of approximately 5 million centipoise. The thermal conductivity is approximately 1.8 W per meter-° C.

FIG. 2 graphically depicts the stability of working examples 1–5 of the present invention as a function of viscosity. Where available, both centrifuge and power cycling data are shown. It is evident that the working examples of the present invention provide stability of the thermal compound with corresponding low viscosity. Working examples 6 and 7, (thermal filler particles of oxide coated aluminum spheres and vanadium boride, respectively), provide even higher thermal conductivities at similar viscosity ranges as working examples 1–5. The compounds having oxide coated aluminum spheres and vanadium boride thermal filler particles have relatively low viscosities that are useful in the applications envisioned by the present invention. The low viscosity is primarily because of the enhanced dispersion and resistance to thermal filler particle flocculation and reflocculation provided by the coupling agents. An additional advantage of the low viscosity is that a greater number of thermal filler particles may be added to the compound if even greater thermal conductivity is required.

While the invention has been described in detail, and with reference to specific embodiments thereof, it will be apparent to one skilled in the art that various changes and modifications can be made without departing form the spirit and scope of the present invention.

We claim:

1. A thermally conductive compound comprising:
   a liquid carrier, said liquid carrier comprising nonpolar, low surface energy organic fluids having a viscosity of 30 to 500 centipoise at 100 degrees C., said liquid carrier selected from the group consisting of mineral and poly(alpha-olefin) oils;
   thermally conductive filler particles dispersed throughout said liquid carrier, said filler particles being present in a minimum amount of about 25 volume percent;
   said particles being higher in surface energy than said liquid carrier so that said liquid carrier wets said particles; and
   about 0.5 to 10 weight percent of a coupling agent having at least one functionality which is reactive with the surface of said thermally conductive filler particles and at least one functionality which is of similar polarity of said liquid carrier wherein said coupling agent is selected from the group consisting of organosilanes, organotitanates, organoaluminates and organozirconates;
   wherein said liquid carrier comprises the remaining amount of said compound.

2. The coupling agent of claim 1 wherein said coupling agent has a preferential wetting of said particles over self-condensation.

3. The thermally conductive compound of claim 1 wherein the viscosity of said compound is between approximately 2 and 20 million centipoise at 100° C.

4. The thermally conductive compound of claim 1 further comprising about 1 to 6 weight percent of high surface area inert particulate additives that absorb excess carrier liquid.

5. The thermally conductive compound of claim 4 wherein said high surface area inert additive comprises fumed silica.

6. The thermally conductive compound of claim 1 wherein said functionality which is reactive with the surface of said thermally conductive filler particles is (RO), wherein R=$C_nH_{2n+1}$.

7. The thermally conductive compound of claim 1 wherein said functionality which is of similar polarity of said liquid carrier is R', wherein R'=$C_nH_{2n+1}$.

8. The thermally conductive compound of claim 1 wherein said functionality which is of similar polarity of said liquid carrier is:

(OCR'), wherein R'=$C_nH_{2n+1}$.

9. The thermally conductive compound of claim 6 wherein the surface area of said fumed silica corresponds to 100–300 m²/gram.

10. The thermally conductive compound of claim 1 further comprising about 2 to 6 weight percent of a nonpolar polymer that readily dissolves in said liquid carrier, wherein said nonpolar polymer is polyisobutylene.

11. The thermally conductive compound of claim 6 wherein said fumed silica is hydrophobic.

12. The thermally conductive compound of claim 1 having high particle packing density and being capable of maintaining particle dispersion in a low viscosity compound.

13. The thermally conductive compound of claim 1 further comprising about 2 to 6 weight percent of a nonpolar polymer that readily dissolves in said liquid carrier, wherein said nonpolar polymer is polyisobutylene.

14. The thermally conductive compound of claim 1 wherein said liquid carrier is chemically saturated.

15. The thermally conductive compound of claim 14 wherein said liquid carrier is a dielectric.

16. The thermally conductive compound of claim 14 wherein said liquid carrier is poly(alpha-olefin).

17. The thermally conductive compound of claim 1 further comprising an antioxidant.

18. The thermally conductive compound of claim 12 further comprising an antioxidant.

19. The thermally conductive compound of claim 1 wherein said thermally conductive filler particles are platelet, spherical, or cubic in shape.

20. The thermally conductive compound of claim 1 wherein said particles are boron nitride.

21. The thermally conductive compound of claim 1 wherein said particles are aluminum spheres coated with $Al_2O_3$.

22. The thermally conductive compound of claim 1 wherein said particles are vanadium boride.

23. The thermally conductive compound of claim 1 wherein the volume percent of thermally conductive filler particles is between 25 and 65 percent.

24. The thermally conductive compound of claim 12 wherein the polarity of said polymer matches the polarity of said liquid carrier.

25. The thermally conductive compound of claim 1 wherein said thermally conductive filler particles are electrical insulators.

26. The thermally conductive compound of claim 1 wherein said liquid carrier is easily removable by organic solvents from solders, molybdenum, gold, copper, chromium, or titanium.

27. The thermally conductive compound of claim 1 wherein said liquid carrier is noncorrosive to solders, molybdenum, ceramic, gold, copper, chromium, or titanium.

28. The thermally conductive compound of claim 1 wherein the surfaces of said thermally conductive filler particles are free of organic contaminants.

29. The thermally conductive compound of claim 1 wherein said coupling agent is of the same polarity of said liquid carrier.

30. A thermally conducting compound comprising:
a liquid carrier, said liquid carrier comprising nonpolar, low surface energy organic fluids having a viscosity of 30 to 500 centipoise at 100 degrees C., said liquid carrier selected from the group consisting of mineral and poly(alpha-olefin) oils;
thermally conductive filler particles dispersed throughout said liquid carrier, said filler particles being present in a minimum amount of about 25 volume percent;
said particles being higher in surface energy than said liquid carrier so that said liquid carrier wets said particles; and
about 0.5 to 10 weight percent of a coupling agent having at least one functionality which is reactive with the surface of said thermally conductive filler particles and at least one functionality which is of similar polarity of said liquid carrier wherein said coupling agent is selected from the group consisting of organosilanes, organotitanates, organoaluminates and organozirconates;
wherein said liquid carrier comprises the remaining amount of said compound.

31. The thermally conducting compound of claim 30 wherein said electronic components are semiconductor chips.

32. The thermally conducting compound of claim 31 wherein said heat dissipating means is the cap of a semiconductor module.

33. The thermally conducting compound of claim 31 wherein said heat dissipating means is an internal thermal enhancement of a semiconductor module.

34. The thermally conducting compound of claim 32 being in the range of approximately 1 to 10 mils in thickness.

35. The thermally conducting compound of claim 33 being in the range of approximately 1 to 10 mils in thickness.

36. The thermally conductive compound of claim 30 further comprising about 1 to 6 weight percent of high surface area inert particulate additives that absorb excess carrier liquid.

37. The thermally conductive compound of claim 30 wherein said liquid carrier is noncorrosive to solders, molybdenum, ceramic, gold, copper, chromium, or titanium.

38. The thermally conductive compound of claim 30 wherein said liquid carrier is poly(alpha-olefin).

39. The thermally conductive compound of claim 30 further comprising an antioxidant.

40. The thermally conductive compound of claim 30 wherein said functionality which is reactive with the surface of said thermally conductive filler particles is (RO), wherein $R=C_nH_{2n+1}$.

41. The thermally conductive compound of claim 30 wherein said functionality which is of similar polarity of said liquid carrier is R', wherein $R'=C_nH_{2n+1}$.

42. The thermally conductive compound of claim 30 wherein said functionality which is of similar polarity of said liquid carrier is:

(OCR'), wherein $R'=C_nH_{2n+1}$.

43. The thermally conductive compound of claim 30 wherein said thermally conductive filler particles are platelet, spherical, or cubic in shape.

44. The thermally conductive compound of claim 30 wherein the volume percent of thermally conductive filler particles is between 25 and 65 percent.

45. The thermally conductive compound of claim 30 wherein said liquid carrier is easily removable by organic solvents from solders, molybdenum, gold, copper, chromium, or titanium.

* * * * *